United States Patent [19]

Hoelzer

[11] Patent Number: 4,575,651

[45] Date of Patent: Mar. 11, 1986

[54] ELECTRONIC REPEAT CYCLE DELAY TIMER

[75] Inventor: John S. Hoelzer, Wauwatosa, Wis.

[73] Assignee: Square D Company, Palatine, Ill.

[21] Appl. No.: 704,894

[22] Filed: Feb. 22, 1985

Related U.S. Application Data

[63] Continuation of Ser. No. 363,323, Mar. 29, 1982, abandoned.

[51] Int. Cl.$^4$ .................... H03K 5/13; H03K 5/158
[52] U.S. Cl. ................................. 307/593; 307/597; 307/602
[58] Field of Search ................ 307/590–596, 307/600

[56] References Cited

U.S. PATENT DOCUMENTS

| | | | |
|---|---|---|---|
| 3,755,695 | 8/1973 | Krick et al. | 307/595 |
| 3,955,731 | 5/1976 | Pomerantz et al. | 307/600 |
| 3,959,731 | 5/1976 | Pomerantz et al. | 307/600 |
| 4,260,812 | 4/1981 | Bjorke | 307/597 |
| 4,260,912 | 4/1981 | Bjorke | 307/597 |

Primary Examiner—Stanley D. Miller
Assistant Examiner—B. P. Davis
Attorney, Agent, or Firm—A. S. Johnston; J. W. Potthast

[57] ABSTRACT

A repeat cycle delay timer in which the on-delay and off-delay periods are individually selectable by individual adjustment of two pulse oscillators respectively associated therewith. The pulses are alternately applied to a pulse counter which produces an output signal after a preselected number of pulses have been counted for that period. The counter then counts pulses from the other oscillator until the end of the other delay period. Different counter outputs may also be selected to produce simultaneous adjustment of both the on-delay and the off-delay periods.

9 Claims, 2 Drawing Figures

ELECTRONIC REPEAT CYCLE DELAY TIMER

This application is a continuation Ser. No. 363,323, filed on Mar. 29, 1982 now abandoned.

BACKGROUND OF THE INVENTION

This invention relates to electronic delay timers of the type employing a counter to establish the time delay period.

Delay timers of the electro-mechanical type are well known. Often they comprise a timer motor which drives a switch actuator to different switch contacts selectively positioned in the path of the actuator according to the amount of delayed time desired. Such timers generally have two modes: on-delay and off-delay. Briefly, in the on-delay mode, a normally open switch is closed at the end of the time delay to actuate, or turn on, the device to be controlled by the timer. In the off-delay mode, a normally closed switch is opened at the end of the delay to de-actuate, or turn off, the controlled device connected therewith.

Repeat cycle delay timers function to respectively and automatically switch from the on-mode to the off-mode. Electronic timers are also known in which the delay time is established by the RC time constants of various, or variable, RC timing circuits. An example of such a timer is shown in the U.S. Pat. No. 3,859,543 of Milovancevic.

More recently, delay timers have become available which employ one or more counters that count pulses from an oscillator. Examples of such timers are shown in U.S. Pat. Nos. 3,714,519 of Swinea, Jr.; 3,950,657 of Sheng et al.; 3,987,316 of Bogel et al.; 4,035,661 of Carlson; and 4,021,646 of Meier.

SUMMARY OF THE INVENTION

The object of the present invention is to provide an improved electronic repeat cycle delay timer which has greater versatility, a wider range of operation and improved precision of control.

In keeping with this objective, I provide a repeat cycle electronic delay timer in which two separate oscillators are used in conjunction with a single oscillator to respectively provide the on-delay and off-delay periods. Adjustments may be made to the one delay period without altering the other delay period.

With respect to each of the oscillators, the delay time range can be selectively varied by changing one of the oscillator components, such as a capacitor. Alternately or additionally, different ranges of timing can be achieved by selecting different ones of a plurality of counter outputs.

Fine adjustment to the delay time within each timing range is made by means of another oscillator component in each oscillator having a value which may be varied continuously. Such variation of the component value causes a continuous variation of the frequency of the oscillator within the range that has been preselected.

BRIEF DESCRIPTION OF THE DRAWINGS

The foregoing objects and advantages will be described in greater detail and further advantages and features will become apparent from the following detailed description of the preferred embodiment which is given with reference to the several views of the drawing, in which:

Referring now to FIG. 1, a functional block diagram of another embodiment of my electronic time delay circuit will be described. A power supply PS is connectable with a source of AC power 188 across AC power terminal 190 and 192 through a switch 194. When switch 194 is closed, power supply PSI generates a relatively high, unregulated full wave DC voltage V1 which is coupled through a lead 196 to an output section circuit OS. The power supply PS also generates the relatively lower, regulated DC voltage V2 which is coupled to the remaining portions of the repeat cycle delay timer through means of a bus lead 198. An important aspect of my invention is that the time base circuit TB contains two, separate, free running oscillators which respectively generate time base pulses on outputs 200 and 202. The time base pulses produced on output 200 are utilized for on-delay timing, and the pulses produced on output 202 are used for off-delay timing. The frequencies of the two timing oscillators are independently and selectively variable so that the on and off delay periods may be individually established. As will be explained, after the on-delay time period is terminated, the off-delay time period is initiated and so on.

Figure 1:
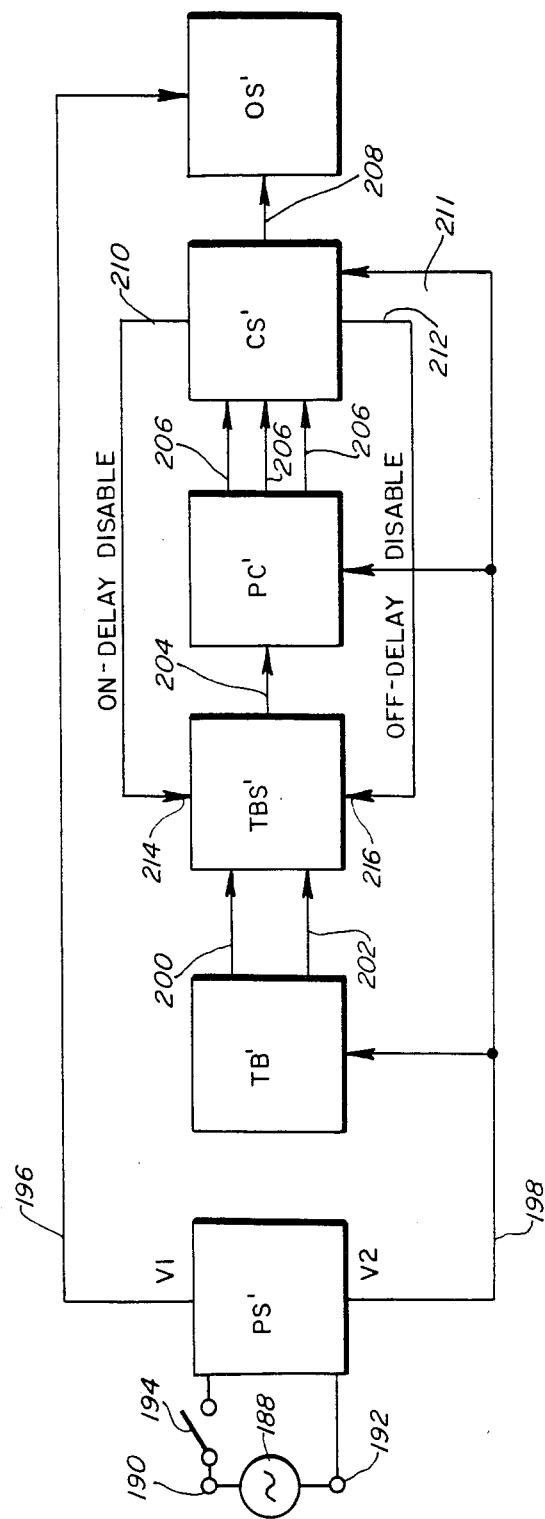
FIG. 1 is a functional block diagram of my repeat cycle delay timer.

A time base select circuit TBS receives the two timing pulses streams from outputs 200 and 202 and selectively applies one of them through its output 204 to the input of a pulse counter circuit PC. The pulse counter PC counts the pulses applied to its input and generates a 1-state signal on a selected one of its outputs 206 when the preselected number of pulses associated with a particular time delay have been counted. Otherwise, the selected output 206 is maintained in a 0-state.

The outputs 206 of pulse counter PC are applied to the input of a control section circuit CS. The code select circuit CS has one output 208 coupled to an output section OS and two outputs 210 and 211 respectively coupled to disable inputs 214 and 216 of time base select circuit TBS. The position of a switch in the code select circuit determines which of the outputs 206 that the code select circuit CS will respond to and actuate the output section OS.

The control section CS by means of selective application of disable signals to these disable inputs 214 and 216 automatically determines which of the pulse trains on time base output 200 and 202 will be applied to the input of pulse counter PC from output 204 of the time base select circuit TBS. When control section CS generates a 1-state signal on its output 210, the time base pulses on output 200 are generated on the output 204 of the time base select circuit TBS. When, on the other hand, control section circuit CS generates a 1-state signal on its output 212, the pulse train on output 202 is coupled to the pulse counter PC through output 204 of the time base select circuit TBS.

The output section circuit OS is energized when a 1-state signal is provided on the output 208 of control section circuit CS. At the end of the off-delay period, output 208 switches to a 0-state signal which de-energizes the output section OS. The on-delay cycle then begins, and at the end of the selected on-delay time period, the output 208 again switches back to a 1-state signal to re-energize the output section circuit OS.

Figure 2:
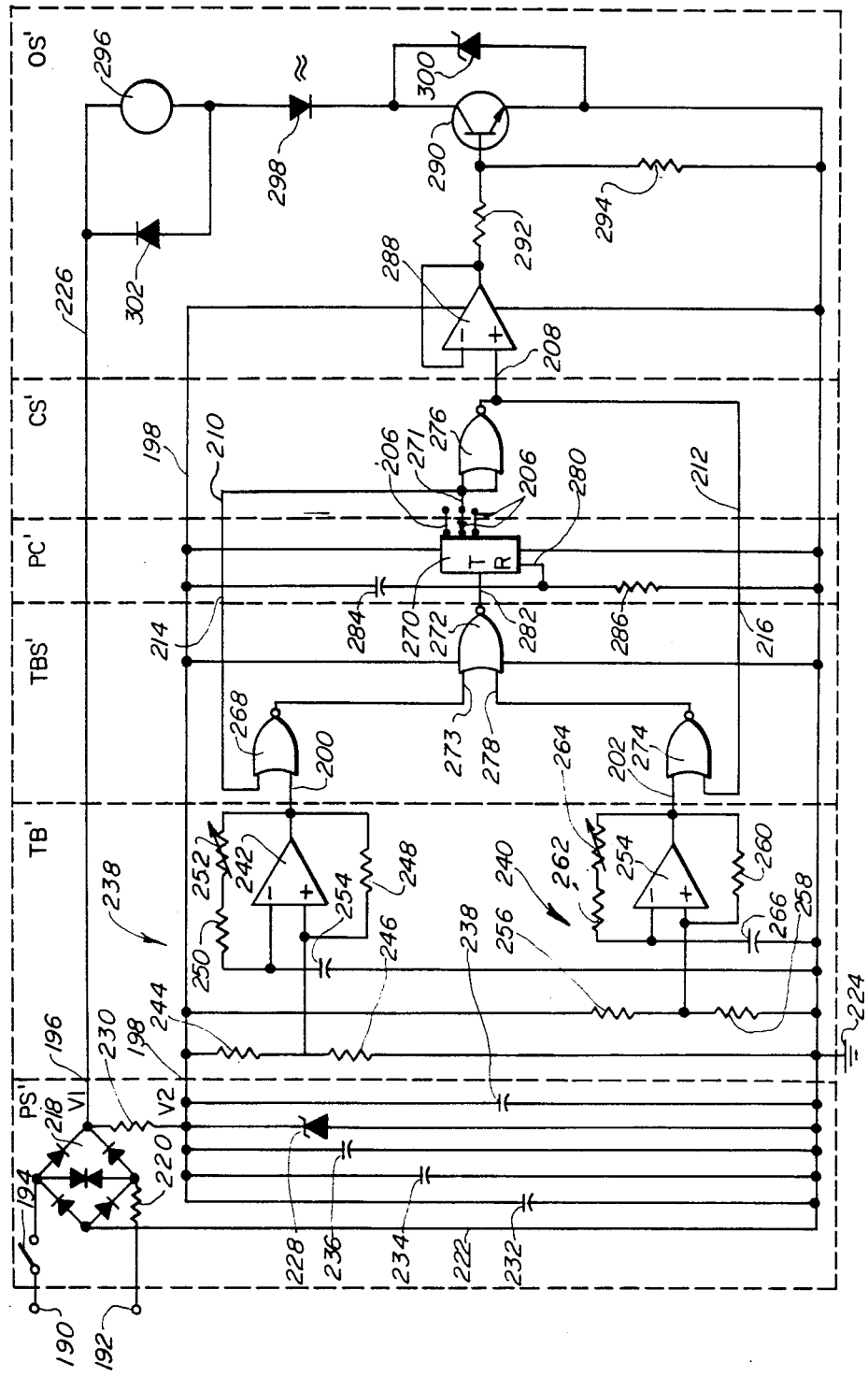
FIG. 2 is a schematic wiring diagram of a preferred embodiment of the circuitry corresponding to the functional blocks of FIG. 1.

Referring now to FIG. 2, the preferred circuitry for implementing the functional blocks of FIG. 1 will be described. As seen, the power supply TS comprises a full wave rectifier 218 having one input connected to AC power lead 190 through switch 194 and an opposite input connected to power lead 192 through a current limiting resistor 220. One output of rectifier 218 is coupled through a lead 222 to ground reference potential 224. Output 196, on which voltage V1 is produced, is coupled through a lead 226 to output section circuit OS to provide power thereto. The other output 198 is taken from the junction between a zener diode 228 and an isolation resistor 230 coupled in series between the one output of the bridge rectifier and ground reference potential 224. A plurality of capacitors 232, 234, 236 and 238 are coupled in parallel with the regulating zener diode 228 to provide noise filtering. In the actual construction of the circuit, capacitors 232, 234 and 236 are physically located adjacent to circuitry of the time base select circuit TBS, the pulse counter circuit PC and the control section circuit CS to maximize the filtering effect in association with those circuits. The zener diode 228 provides the desired regulation of the voltage V2.

The time base circuit TB comprises two identical, but independent, free running pulse oscillators 238 and 240. Oscillator 238 comprises an operational amplifier 242, two biasing resistors 244 and 246, a feedback resistor 248, a fixed resistor 250, a variable resistor 252 and a timing capacitor 254. The frequency of the oscillator is determined by the resistance value established for a variable resistor 250 and the capacitance value selected for capacitor 254. The oscillator produces pulses on the output of operational amplifier 242 which is provided to output 200 of the time base circuit TB the frequency of these pulses determines the on-delay time.

The off-delay time oscillator 240, as stated, is identical in structure to the on-delay time circuit oscillator 238 and functions in an identical fashion. Off-delay time oscillator 240 comprises an operational amplifier 254, biasing resistors 256 and 258, a positive feedback resistor 260, a fixed negative feedback resistor 262, a variable negative feedback resistor 264 and a timing capacitor 266. The frequency of the pulses produced on the output of operational amplifier 254 and applied to output 202 of time base circuit TB is determined by the resistance values selected for variable resistor 264 and the capacitance value selected for capacitor 266. The time base select circuit TBS determines which of the pulse trains from on-delay oscillator 238 and off-delay oscillator 240 will be applied to and counted by pulse counter TC. The on-delay pulses at output 200 are applied to one input of a NOR gate 268. The other input is coupled to output 210 of code select circuit CS and input 214 of time base select circuit TBS. The output 210 is taken from one of the outputs of a ripple counter 270 of pulse counter circuit PS which is connected thereto through a range select switch 271. Depending on which of the outputs 206 is connected to switch 271, the delay time will be shorter or longer. The output 210 is maintained in a 0-state condition until the selected on-delay time period has passed. When input 214 is in this 0-state condition the NOR gate 268 is enabled to generate 1-state pulses on its output 270 in response to 0-state pulses applied to its other input from on-delay oscillator 238. These pulses are applied to an input 270 of a NOR gate 272.

The off-delay pulses, on the other hand, are applied to an input of another NOR gate 274. The other input to NOR gate 274 is taken from input 216 of the time base select circuit TBS which, in turn, is connected to output 212 of the control section circuit CS. Output 212 is coupled to the output of a NOR gate 276 which also comprises output 208 of control section circuit CS. Whenever the input to NOR gate 276 is in a 0-state, the output of NOR gate 276 is in a 1-state condition. This 1-state signal when applied to NOR gate 274 disables it from generating anything other than a 0-state signal on its output. Conversely, whenever the input to NOR gate 276 is in a 1-state, its output is in a 0-state. When this 0-state signal is applied to the input from NOR gate 274, it is enabled to respond to the pulses from off-delay oscillator 240 and apply them to an input 278 of NOR gate 272.

The pulse counter circuit PC comprises, as previously stated, a multi-stage ripple counter 270. Ripple counter 270 has a reset input 280 and a clock or toggle input 282. Counter 270 counts the pulses that are applied to its toggle input 282 except when reset. The reset input 280 is coupled to the junction between a capacitor 284 and a resistor 286 connected in series between DC voltage bus 198 and ground reference potential 124. When switch 194 is first closed and power applied, a 1-state pulse is coupled through capacitor 284 and applied to reset input 280. This causes counter 170 to reset to a condition in which all its stages are in the same state, and the count is zero. Subsequently, the capacitor 284 charges and the reset input 280 reverts to a 0-state to enable the counter 270 to count.

Upon reset, a 0-state signal is generated on the output 208 of counter 270 and thus a 1-state signal is generated on the off-delay disable output 212 and a 0-state is generated on the on-delay disable output 210. Consequently, the on-delay pulses from oscillator 238 are coupled through NOR gate 268 and NOR gate 272 and applied to the counter input 282. The counter 270 then counts these pulses at the rate at which they are generated by oscillator 238 until a preselected count is reached. The time that it takes for counter 270 to reach this preselected count, of course, depends upon the frequency at which on-delay timer oscillator 238 generates pulses.

When this count is reached, a 1-state signal is generated by counter 270 and thus a 1-state disable signal is applied to the input of NOR gate 268. Also, a 0-state signal is applied to the input of NOR gate 274. Consequently, pulses from on-delay timer 238 are blocked by NOR gate 268, and the pulses from off-delay timer 240 are coupled through NOR gates 274 and 272 and applied to input 282 of counter 270. Counter 270 then responds to these pulses and continues counting but now at the frequency rate established by off-delay timer oscillator 240. The 1-state signal will continue to be generated on the output of counter 270 only until another preselected count is reached. When the final count is reached, the counter automatically resets to zero, and the delay circuit returns to the on-delay mode. This alternating process is repeated indefinately.

During the off-delay mode, the 1-state signal at output 208 of the control section circuit CS is applied to the non-inverting input of an operational amplifier 288. Amplifier 288, in turn, generates a 1-state signal on its output which is applied to the base of a transistor 290 through a resistor 292. A resistor 294 also coupled to the base provides ground base bias for transistor 290. Transistor 290, in response to this 1-state signal, turns on to energize a relay coil 296. During this time, current through a light emitting diode 298 is caused to light to indicate that the circuit is in its off-delay mode. A zener diode 300 is coupled across transistor 290 to provide transient protection thereto, and an optional free wheeling diode 302 is coupled across relay 296.

When output 208 of control section circuit CS switches to a 0-state at the beginning of the on-delay mode of operation, a 0-state signal is generated by operational amplifier 288 and applied to the basic transistor 290. Transistor 290 then turns off to de-energize relay 296 and light emitting diode 298.

While a particular embodiment has been disclosed to illustrate my invention, it should be clear that many changes can be made thereto without departing from the scope of my invention as defined by the appended claims. For instance, although not shown it should be clear that the timing capacitors 254 and 266 could be replaced by a plurality of capacitors and a rotary selection switch for choosing the one associated with a selected delay time. Also, it is clear that the control section circuit CS could drive more than a single output section circuit.

I claim:

1. A repeat cycle timer, comprising:
   means for generating a first train of pulses at a first frequency;
   means for generating a second train of pulses at a second frequency;
   means for counting a predetermined number of pulses; and,
   means for alternately selecting said first train of pulses and said second train of pulses into said means for counting a predetermined number of pulses in order to count said first train of pulses for a first time interval and said second train of pulses for a second time interval, both said first and said second time intervals dependent upon the respective frequencies and said predetermined number of pulses, in order to repeatedly make timing cycles having a duration of said first and second time intervals.

2. The apparatus of claim 1 further comprising means for controlling said first frequency of said first oscillator.

3. The apparatus as in claim 1 further comprising means for controlling said second frequency of said second oscillator.

4. The apparatus of claim 2 or 3 wherein said means for controlling a frequency comprises a variable resistor.

5. The apparatus as in claim 2 or 3 wherein said means for controlling a frequency comprises a capacitor.

6. The apparatus as in claim 1 wherein said counter further comprises:
   a plurality of counter elements each capable of counting a fixed number of pulses; and
   a switch for selecting a desired one of said counter elements in order to select said predetermined number of pulses.

7. A repeat cycle timer, comprising:
   a first oscillator capable of generating first pulses at a first frequency;
   a second oscillator capable of generating second pulses at a second frequency;
   a selection circuit capable of accepting said first pulses at a first input and capable of accepting said second pulses at a second input for selecting either said first pulses or said second pulses for counting, and said selection being made in response to a first logic signal;
   a counter capable of accepting pulses from said selection circuit for generating a second logic signal after a predetermined number of pulses are counted; and,
   a logic circuit responsive to said second logic signal for generating said first logic signal in order to control said selection circuit to select pulses from either said first oscillator or said second oscillator in order to generate alternate time intervals by counting pulses from either said first oscillator or said second oscillator.

8. The apparatus as in claim 1 further comprising:
   a relay; and,
   an output circuit responsive to said logic circuit for energizing said relay when pulses from said first oscillator are selected for counting, and for de-energizing said relay when pulses from said second oscillator are selected for counting.

9. A repeat cycle timer, comprising:
   a first oscillator capable of generating first pulses at a first frequency;
   a second oscillator capable of generating second pulses at a second frequency;
   a selection circuit capable of accepting said first pulses at a first input and capable of accepting said second pulses at a second input for selecting either said first pulses or said second pulses for counting, and said selection being made in response to a first logic signal;
   a counter capable of accepting pulses from said selection circuit for generating a second logic signal after a predetermined number of pulses are counted;
   a logic circuit responsive to said second logic signal for generating said first logic signal in order to control said selection circuit to select pulses from either said first oscillator or said second oscillator in order to generate alternate time intervals by counting pulses from either said first oscillator or said second oscillator;
   a relay; and,
   an output circuit responsive to said logic circuit for energizing said relay when pulses from said first oscillator are selected for counting, and for de-energizing said relay when pulses from said second oscillator are selected for counting.

* * * * *